United States Patent
Li et al.

(10) Patent No.: US 10,648,070 B2
(45) Date of Patent: May 12, 2020

(54) MASK ASSEMBLY AND METHOD FOR MANUFACTURING THE SAME AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Dongwei Li, Beijing (CN); Baojun Li, Beijing (CN); Chun Chieh Huang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 47 days.

(21) Appl. No.: 15/745,401

(22) PCT Filed: May 17, 2017

(86) PCT No.: PCT/CN2017/084717
§ 371 (c)(1),
(2) Date: Jan. 16, 2018

(87) PCT Pub. No.: WO2017/215399
PCT Pub. Date: Dec. 21, 2017

(65) Prior Publication Data
US 2018/0209028 A1 Jul. 26, 2018

(30) Foreign Application Priority Data
Jun. 15, 2016 (CN) .......................... 2016 1 0423043

(51) Int. Cl.
*C23C 14/04* (2006.01)
*C23C 14/24* (2006.01)
*H01L 27/32* (2006.01)

(52) U.S. Cl.
CPC ............ *C23C 14/04* (2013.01); *C23C 14/042* (2013.01); *C23C 14/24* (2013.01); *H01L 27/3223* (2013.01)

(58) Field of Classification Search
CPC ....... C23C 14/04; C23C 14/042; C23C 14/24; H01L 27/3223
See application file for complete search history.

(56) References Cited

U.S. PATENT DOCUMENTS 7,282,240 B1 * 10/2007 Jackman ................ B82Y 10/00
427/282
2008/0018236 A1 1/2008 Arai et al.
(Continued)

FOREIGN PATENT DOCUMENTS

| CN | 101015234 A | 8/2007 |
|---|---|---|
| CN | 103205695 A | 7/2013 |

(Continued)

OTHER PUBLICATIONS

International Search Report & English Translation of Box V of Written Opinion, for PCT Patent Application No. PCT/CN2017/084717, dated Aug. 1, 2017, 9 pages.
(Continued)

*Primary Examiner* — Fernando L Toledo
*Assistant Examiner* — Neil R Prasad
(74) *Attorney, Agent, or Firm* — Kinney & Lange, P.A.

(57) ABSTRACT

The present disclosure provides a mask assembly and a method for manufacturing the same, and a display device. The mask assembly includes a frame, a first mask and a second mask, and the first mask and the second mask are (Continued)

superposed on the frame; the first mask includes an opening region, the second mask includes an evaporation region in which a first evaporation hole is provided for allowing an evaporation material to pass therethrough and a buffer region surrounding the evaporation region and configured to block off the evaporation material, and an orthographic projection of the boundary of the opening region onto the second mask is located within the buffer region.

18 Claims, 12 Drawing Sheets

(56) References Cited

U.S. PATENT DOCUMENTS

| | | | | |
|---|---|---|---|---|
| 2013/0059063 | A1* | 3/2013 | Kawato | C23C 14/042 427/66 |
| 2015/0047560 | A1 | 2/2015 | Kang | |
| 2016/0104862 | A1 | 4/2016 | Li | |
| 2016/0263607 | A1 | 9/2016 | Wang et al. | |
| 2016/0322572 | A1* | 11/2016 | Chen | H01L 51/0011 |

FOREIGN PATENT DOCUMENTS

| | | |
|---|---|---|
| CN | 103757589 A | 4/2014 |
| CN | 104294212 A | 1/2015 |
| CN | 104393195 A | 3/2015 |
| CN | 104630705 A | 5/2015 |
| CN | 105039905 A | 11/2015 |
| CN | 106086781 A | 11/2016 |
| KR | 20100101436 A | 9/2010 |

OTHER PUBLICATIONS

First Chinese Office Action, for Chinese Patent Application No. 201610423043.X, dated Jan. 3, 2018, 11 pages.

* cited by examiner

MASK ASSEMBLY AND METHOD FOR MANUFACTURING THE SAME AND DISPLAY DEVICE

This application is the national phase of PCT Application No. PCT/CN2017/084717 filed on May 17, 2017, which in turn claims the benefit of Chinese Patent Application No. 201610423043.X filed on Jun. 15, 2016 in the State Intellectual Property Office of China, the whole disclosure of which is incorporated herein by reference.

BACKGROUND OF THE DISCLOSURE

Field of the Disclosure

Embodiments of the disclosure generally relate to the field of display technologies, and in particular to a mask assembly and a method for manufacturing the same, and a display device.

Description of the Related Art

Organic Light-Emitting Diode (OLED for short) display has advantages such as self-luminescence, a smaller thickness, a light weight, a fast response speed, a wide angle of view, rich colors, a high brightness, a low power consumption, resistance to high and low temperature and the like, and is widely applied in products such as a mobile phone, a watch, a computer, a TV set and the like. During process of manufacturing the OLED display, an evaporator may be used in cooperation with a mask assembly to form an electrode pattern, an organic electroluminescence pattern.

In related arts, a mask assembly comprises a metal frame, an Open MASK and a fine metal mask (FMM for short), the Open MASK comprises an opening region, the FMM comprises evaporation holes precisely arranged in the whole FMM, the Open MASK and the FMM are welded at their peripheries onto the metal frame, the FMM is superposed on the Open MASK, and among the evaporation holes of the FMM, a region where the evaporation holes whose orthographic projections onto the Open MASK are located within the opening region is an evaporation region of the mask assembly (that is, the evaporation region of the mask assembly is defined by the opening region of the Open MASK, and the boundary of the evaporation region is the boundary of the opening region of the Open MASK). When forming an pattern on a substrate, the mask assembly is placed between the evaporator and the substrate, such that relative positions of the mask assembly and the substrate are fixed and the evaporation region of the mask assembly is aligned with a region of the substrate where the pattern is to be formed, then an evaporation material from the evaporator is evaporated through the evaporation region onto the substrate so as to form the corresponding pattern in the region where the pattern is to be formed.

However, since in the related art, the evaporation region of the mask assembly is defined by the opening region of the Open MASK, and the Open MASK will be easily deformed under a force during welding the FMM onto the Open MASK, relative positions of the opening region of the Open MASK and the metal frame will be changed, thereby the evaporation region of the mask assembly is changed, and the evaporation region of the mask assembly cannot be effectively aligned with the region of the substrate where the pattern is to be formed. Thus, the mask assembly has a poorer alignment accuracy.

SUMMARY

The present disclosure has been made in order to overcome at least one of the above and other problems and deficiencies existing in the prior arts.

According to an aspect of the present disclosure, there is provided a mask assembly, the mask assembly comprising a frame, a first mask and a second mask, the first mask and the second mask are superposed on the frame;

the first mask comprises an opening region, the second mask comprises an evaporation region in which a first evaporation hole is provided for allowing an evaporation material to pass therethrough and a buffer region surrounding the evaporation region and configured to block off the evaporation material, and an orthographic projection of the boundary of the opening region onto the second mask is located within the buffer region.

In an embodiment, a first buffer structure is provided in the buffer region and configured to reduce a stress difference between the buffer region and the evaporation region.

In an embodiment, a first recess is provided in the buffer region.

In an embodiment, an opening face of the first recess is located at a face of the second mask facing away from the first mask.

In an embodiment, the buffer region has an annular shape.

In an embodiment, the first mask further comprises a first peripheral region surrounding the opening region and configured to block off the evaporation material; and the second mask further comprises a second peripheral region surrounding the buffer region, and an orthographic projection of the second peripheral region onto the first mask is located within the first peripheral region.

In an embodiment, a second buffer structure is provided in the second peripheral region and configured to reduce a stress difference between the second peripheral region and the evaporation region. Exemplarily, the second buffer structure comprises a second evaporation hole and/or a second recess.

In some embodiments, a plurality of first recesses are provided in the buffer region, and the mask assembly comprises at least one of following items (1) to (9): (1) opening faces of all the evaporation holes have areas equal to each other; (2) opening faces of all the recesses have areas equal to each other; (3) an area of an opening face of each said evaporation hole is equal to an area of an opening face of each said recess; (4) a depth of each said recess is larger than or equal to a half of a thickness of the second mask and smaller than the thickness of the second mask; (5) the opening region has a circular shape; (6) the evaporation region has a circular shape; (7) the buffer region has an annular shape; (8) a radius of an inner ring of the buffer region is equal to a radius of the evaporation region; and (9) a radius of the opening region is larger than the radius of the inner ring of the buffer region and smaller than a radius of an outer ring of the buffer region.

In an embodiment, the frame the frame is a metal frame, the second mask is a fine metal mask, and the first mask and the second mask are welded onto the frame respectively.

According to another aspect of the present disclosure, there is provided a method for manufacturing a mask assembly, comprising steps of:

providing a frame;

forming a first mask comprising an opening region;

forming a second mask, the second mask comprising an evaporation region in which a first evaporation hole is provided for allowing an evaporation material to pass therethrough and a buffer region surrounding the evaporation region and configured to block off the evaporation material, and an orthographic projection of the boundary of the opening region onto the second mask is located within the buffer region; and superposing the first mask and the second mask on the frame, such that an orthographic projection of the boundary of the opening region onto the second mask is located within the buffer region.

In an embodiment, the step of forming a second mask comprises forming, in the buffer region, a first buffer structure configured to reduce a stress difference between the buffer region and the evaporation region.

In an embodiment, a first recess is provided in the buffer region.

In an embodiment, an opening face of the first recess is located at a face of the second mask facing away from the first mask.

In an embodiment, the buffer region has an annular shape.

In an embodiment, the first mask further comprises a first peripheral region surrounding the opening region and configured to block off the evaporation material; the second mask further comprises a second peripheral region surrounding the buffer region, and the step of superposing the first mask and the second mask on the frame further comprises:

superposing the first mask and the second mask on the frame such that an orthographic projection of the second peripheral region onto the first mask is located within the first peripheral region.

In an embodiment, a second buffer structure is provided in the second peripheral region and configured to reduce a stress difference between the second peripheral region and the evaporation region. Exemplarily, the second buffer structure comprises a second evaporation hole and/or a second recess formed in the second peripheral region.

In some embodiments, a plurality of first recesses are provided in the buffer region, and the mask assembly is manufactured such that it comprises at least one of following items (1) to (9): (1) opening faces of all the evaporation holes have areas equal to each other; (2) opening faces of all the recesses have areas equal to each other; (3) an area of an opening face of each said evaporation hole is equal to an area of an opening face of each said recess; (4) a depth of each said recess is larger than or equal to a half of a thickness of the second mask and smaller than the thickness of the second mask; (5) the opening region has a circular shape; (6) the evaporation region has a circular shape; (7) the buffer region has an annular shape; (8) a radius of an inner ring of the buffer region is equal to a radius of the evaporation region; and (9) a radius of the opening region is larger than the radius of the inner ring of the buffer region and smaller than a radius of an outer ring of the buffer region.

In an embodiment, the frame is a metal frame, and the second mask is a fine metal mask, and the step of superposing the first mask and the second mask on the frame comprises:

welding the first mask and the second mask onto the frame respectively such that the first mask and the second mask are superposed on each other.

According to a further aspect of the present disclosure, there is provided a display device comprises a pattern formed by using the mask assembly described in any one of embodiments of the present disclosure.

BRIEF DESCRIPTION OF THE DRAWINGS

In order to illustrate technical solutions in embodiments of the present application more clearly, a simple introduction to the drawings for depiction of embodiments of the disclosure will be set forth below. It is apparent that, the drawings as illustrated below are only some exemplary embodiments of the present disclosure, and other drawings may also be obtained by those skilled in the art on the basis of these drawings without paying any inventive effort.

Herein, the drawings are incorporated into the description and constitute parts of the description, which illustrate some exemplary embodiment of the present disclosure, and are intended to set forth principles of the present disclosure in combination with the description.

DETAILED DESCRIPTION OF PREFERRED EMBODIMENTS

In order to make objects, technical schemes and advantages of the present disclosure more definite, the present disclosure will be described in detail hereinafter with reference to drawings. Obviously, the described embodiments are merely a part of embodiments of the present disclosure, rather than being all embodiments thereof. Based on the embodiments of the present disclosure, all other embodiments obtained by those ordinary skilled in the art without any inventive step will fall within the scope of the present disclosure.

Figure 1A:
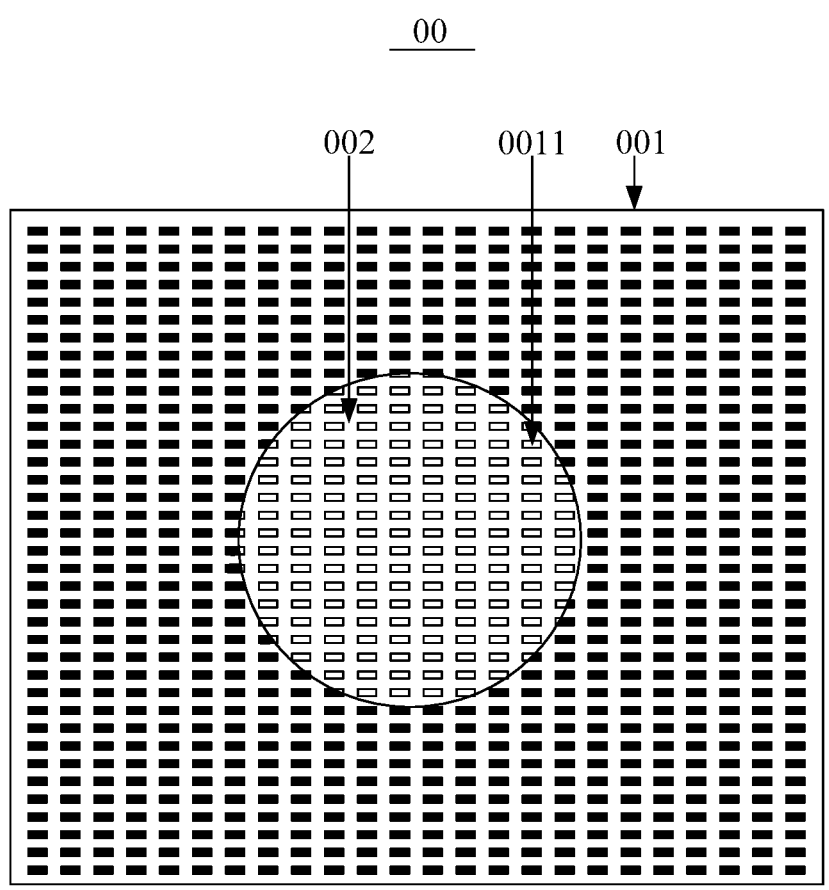
FIG. 1A is a structural schematic diagram of a mask assembly provided in related arts.

FIG. 1A is a structural schematic diagram showing a mask assembly 00 provided in related arts. Referring to FIG. 1A, the mask assembly 00 comprises a metal frame, an Open MASK and a FMM 001, the Open MASK comprises an opening region, the FMM 001 comprises evaporation holes 0011 precisely arranged in the whole FMM, the Open MASK and the FMM are welded at their peripheries onto the metal frame, the FMM 001 is superposed on the Open MASK, and among the evaporation holes 0011 of the FMM, a region where the evaporation holes 0011 whose orthographic projections onto the Open MASK are located within the opening region is an evaporation region 002 of the mask assembly 00. When forming an pattern on a substrate (not shown in FIG. 1A), the mask assembly 00 is provided between an evaporator and the substrate, such that relative positions of the mask assembly 00 and the substrate are fixed and the evaporation region 002 of the mask assembly 00 is aligned with a region of the substrate where the pattern is to be formed, then an evaporation material from the evaporator is evaporated through the evaporation region 002 onto the substrate so as to form the corresponding pattern in the region where the pattern is to be formed.

Figure 1B:
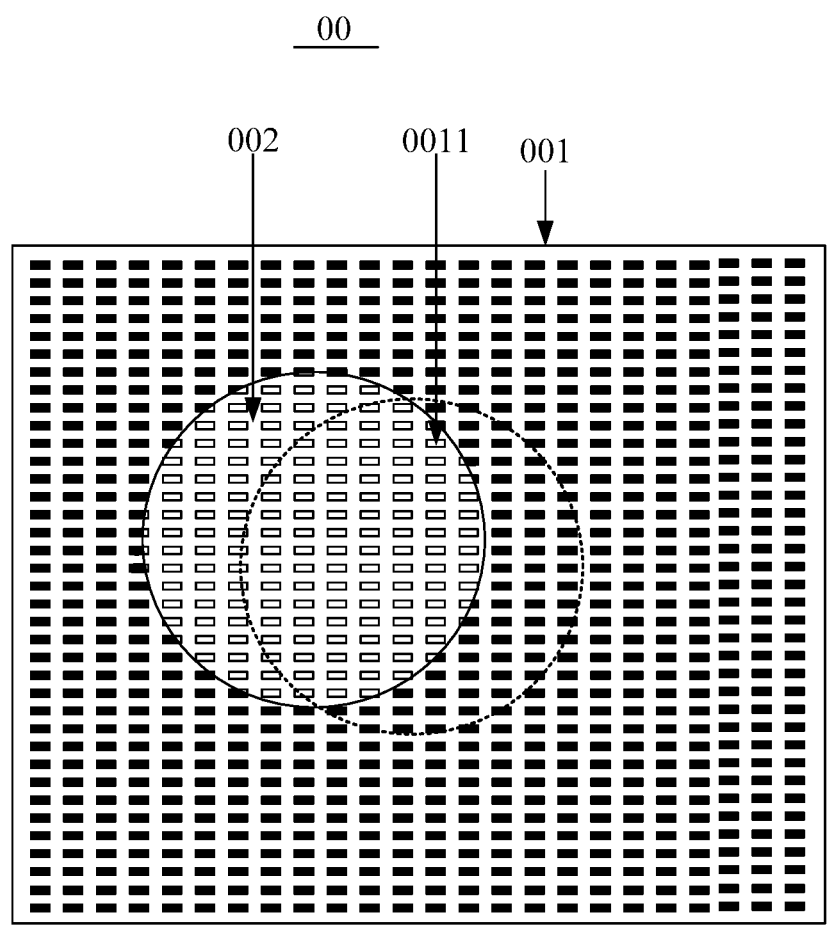
FIG. 1B is a structural schematic diagram of another mask assembly provided in related arts.

However, since the evaporation region 002 of the mask assembly 00 is defined by the opening region of the Open MASK, and the Open MASK will be easily deformed under a force during welding the FMM 001 with respect to the Open MASK, relative positions of the opening region of the Open MASK and the metal frame will be changed, thereby the evaporation region 002 of the mask assembly 00 is changed; for example, since the Open MASK is deformed under a force during welding the FMM 001 with respect to the Open MASK, relative positions of the opening region of the Open MASK and the metal frame are changed, so that the evaporation region 002 of the mask assembly 00 is changed from a position shown in FIG. 1A to a position shown in FIG. 1B (a region indicated by a dashed circle in FIG. 1B is the opening region of the Open MASK before the relative positions of the Open MASK and the metal frame are changed). As such, since positions of the mask assembly 00 and the substrate are relatively fixed, change of the position of the evaporation region 002 will result in that the evaporation region 002 of the mask assembly 00 cannot be effectively aligned with the region of the substrate where the pattern is to be formed, and thus, the mask assembly 00 has a poorer alignment accuracy.

Figure 2A:
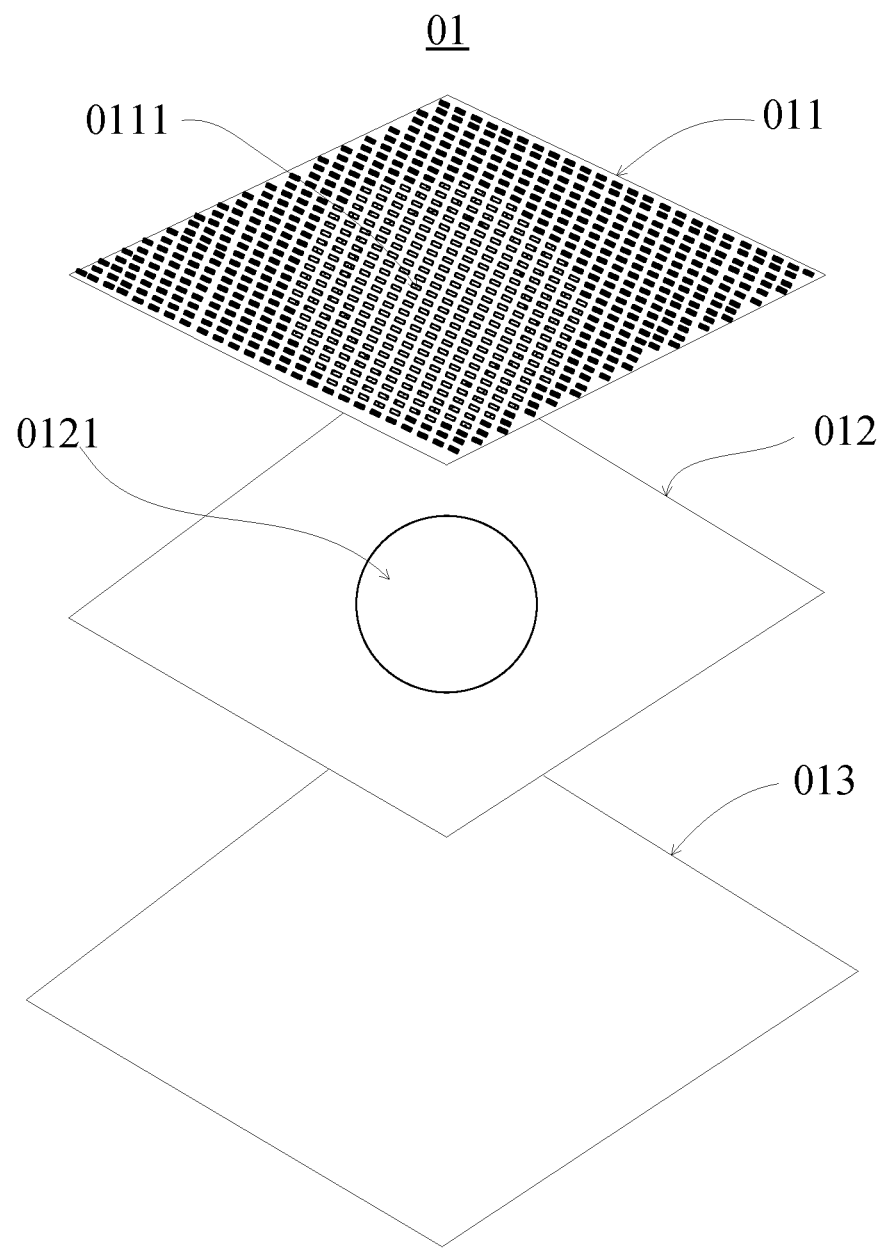
FIG. 2A is a perspective exploded view showing a structure of a mask assembly according to an embodiment of the present disclosure.
Figure 2B:
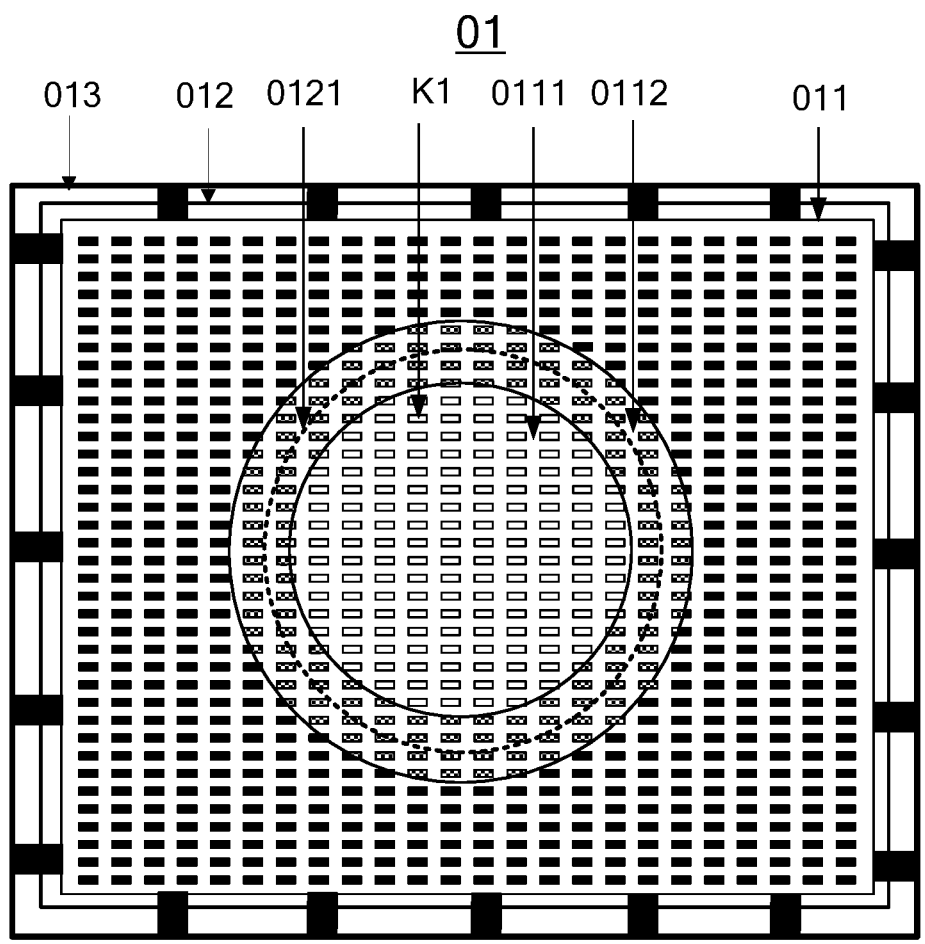
FIG. 2B is a plan schematic diagram showing a structure of a mask assembly according to an embodiment of the present disclosure.

FIGS. 2A and 2B show a structure of a mask assembly 01 provided by an embodiment of the present disclosure. Referring to FIGS. 2A and 2B, the mask assembly 01 comprises a frame 013, a first mask 012 and a second mask 011, and the first mask 012 and the second mask 012 are superposed on the frame 013.

In an example, the first mask comprises an opening region 0121, the second mask 011 comprises an evaporation region 0111 in which a first evaporation hole K1 is provided for allowing an evaporation material to pass therethrough and a buffer or dummy region 0112 surrounding the evaporation region 0111 and configured to block off the evaporation material, and an orthographic projection of the boundary of the opening region 0121 onto the second mask 011 is located within the buffer region 0112.

As described above, in the mask assembly 01 provided by the embodiment of the present disclosure, the evaporation region of the mask assembly is defined by the second mask, the orthographic projection of the boundary of the opening region of the first mask onto the second mask is located within the buffer region of the second mask surrounding the evaporation region, and the buffer region is used to block off the evaporation material. As such, due to presence of the buffer region, a change in position of the opening region when fixing the second mask will not adversely affect the evaporation region, thus the mask assembly has a better alignment accuracy, solving the problem of the poorer alignment accuracy of the mask assembly in related art, achieving effect of improving the alignment accuracy of the mask assembly.

In an embodiment, as shown in FIG. 2B, the buffer region 0112 has an annular shape. Specific structure of the frame may refer to related techniques, and will not be repeatedly described in embodiments of the present disclosure.

Figure 2C:
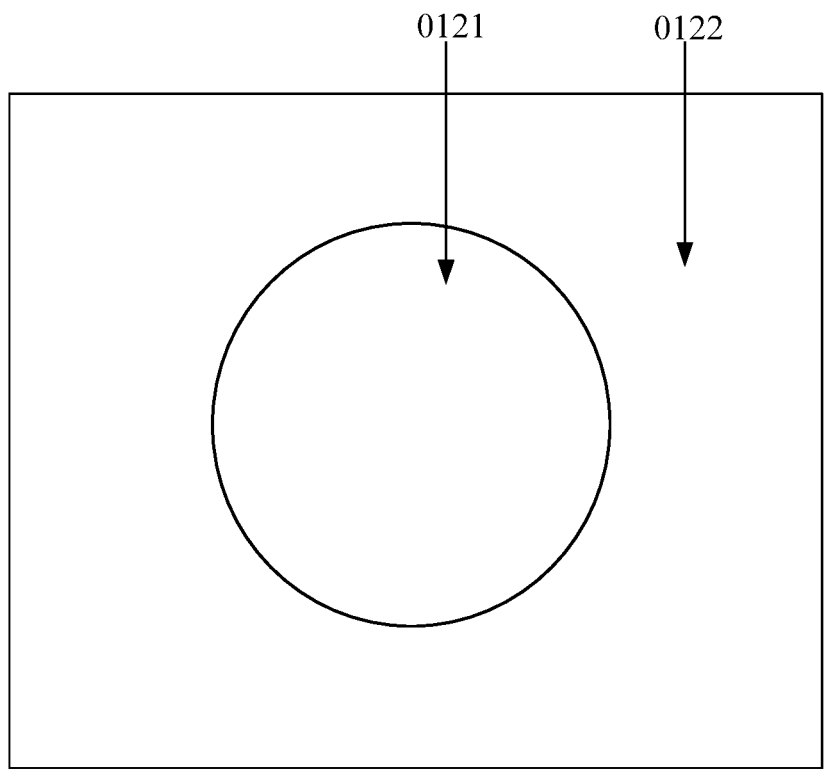
FIG. 2C is a plan schematic diagram showing a structure of a first mask according to an embodiment of the present disclosure.

In an embodiment, please refer to FIG. 2C, which shows a structural schematic diagram of a first mask 012 provided by an embodiment of the present disclosure, the first mask 012 comprises the opening region 0121 and a first peripheral region 0122 surrounding the opening region 0121. In an example, regions of the first mask 012 are consisted of the opening region 0121 and first peripheral region 0122, and the first peripheral region 0122 is configured to block off the evaporation material. Exemplarily, as shown in FIG. 2C, the first mask 012 has a rectangular surface, the opening region 0121 may have a circular shape, and first peripheral region 0122 is a region of the first mask 012 except the opening region 0121. In practice application, the opening region 0121 may be in a rectangular or other shape, which will not be limited in embodiments of the present disclosure.

Figure 2D:
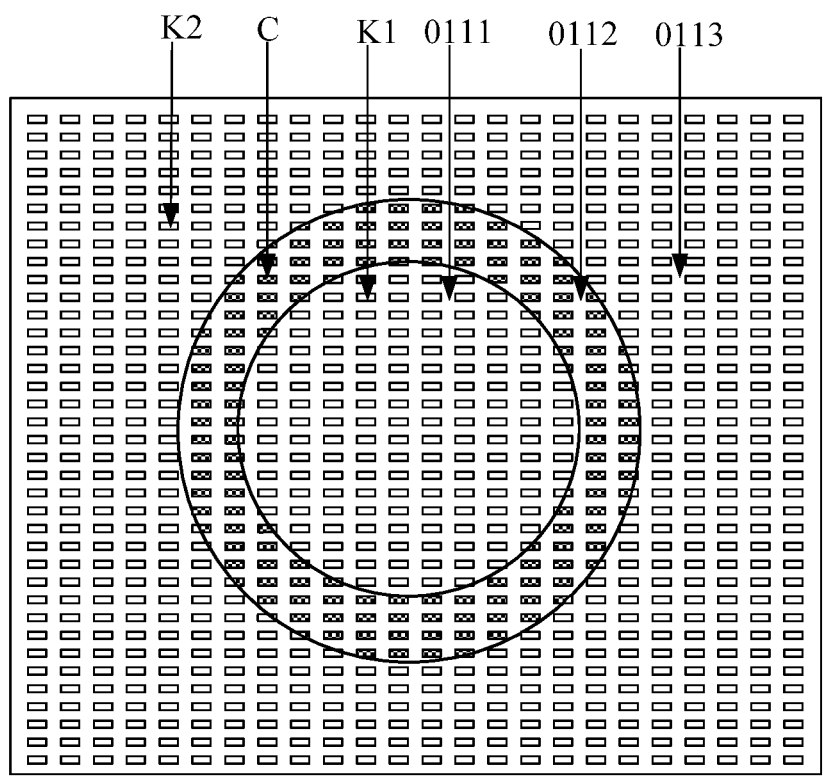
FIG. 2D is a plan schematic diagram showing a structure of a second mask according to an embodiment of the present disclosure.

In an embodiment, please refer to FIG. 2D, which shows a structural schematic diagram of a second mask 011 provided by an embodiment of the present disclosure, and the second mask 011 comprises the evaporation region 0111, the buffer region 0112 surrounding the evaporation region 0111, and a second peripheral region 0113 surrounding the buffer region 0112. In an example, regions of the second mask 011 are consisted of the evaporation region 0111, the buffer region 0112 and the second peripheral region 0113. Exemplarily, the second mask 011 has a rectangular surface, the evaporation region 0111 may have a circular shape, the buffer region 0112 may have an annular shape, and the second peripheral region 0113 is a region of the second mask 011 except the evaporation region 0111 and the buffer region 0112. It is noted that, in practice application, the surface of the second mask 011, the evaporation region 0111 and the buffer region 0112 may be in other shapes, which may be specifically set as required and will not limited in embodiments of the present disclosure.

Further, as shown in FIG. 2D, an evaporation hole K is provided in the evaporation region 0111 for allowing the evaporation material to pass therethrough, and the buffer region 0112 is configured to block off the evaporation material. Exemplarily, a first recess C is provided as buffer structure in the buffer region 0112, and may reduce a stress difference between the buffer region 0112 and the evaporation region 0111 so as to avoid appearance of any wrinkle on the second mask 011 due to stretching when the second mask 011 is provided onto the frame. In an embodiment, when the second mask 011 is provided onto the frame, an opening face of the first recess C may be located at a surface of the second mask 011 facing away from the first mask 012, but embodiments of the present disclosure, is not limited to this.

In some embodiments, an evaporation hole is provided in the second peripheral region of the second mask 011; or, a second recess is provided in the second peripheral region of the second mask 011. Exemplarily, as shown in FIG. 2D, an evaporation hole K2 is provided in the second peripheral region 0113 of the second mask 011. In an example, the evaporation hole or second recess provided in the second peripheral region 0113 is used as a buffer structure, which may reduce a stress difference between the second peripheral region 0113 and the evaporation region 0111 so as to avoid appearance of any wrinkle on the second mask 011 due to stretching when the second mask 011 is provided onto the frame. In an example, in the mask assembly 01 shown in FIG. 2B, an orthographic projection of the second peripheral region onto the first mask is located in the first peripheral region. It is noted that in practice application, the second recess and the first recess C may have a same structure or may have different structures, and the evaporation hole K2 and the evaporation hole K1 may also have a same structure or may have different structures, which will not limited in embodiments of the present disclosure.

In some embodiments, the evaporation holes K1, K2 may be a circular hole, a rectangular hole, a square hole of other shaped-hole, opening faces of all the evaporation holes K1, K2 may have same shapes and have areas equal to each other, opening faces of all the recesses (including the first recess C and the second recess) may have same shapes and have areas equal to each other, an area of an opening face of each of the evaporation holes K1, K2 may be equal to an area of an opening face of each of the recesses, and/or a depth of each of the recesses is larger than or equal to a half of a thickness of the second mask 011 and smaller than the thickness of the second mask, which can reduce stress differences at different positions on the second mask 011 as much as possible. In an example, the evaporation holes K1, K2 may be formed by a full-etching process, through which the second mask 011 may be etched therethrough so as to form the evaporation holes K1, K2, and the first recess C and the second recess may each be formed by using a half-etching process, through which the second mask 011 will not be etched therethrough so as to form the recess.

Figure 2E:
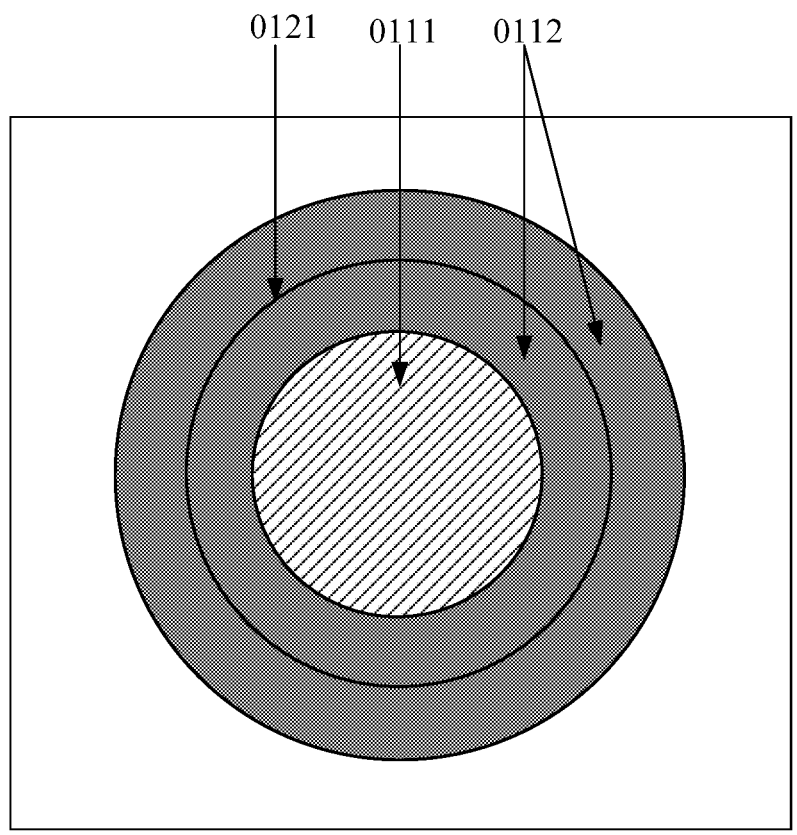
FIG. 2E is a schematic diagram showing a positional relationship among an opening region, an evaporation region and a buffer region according to an embodiment of the present disclosure.

Further, please refer to FIG. 2E, which shows a positional relationship among the opening region 0121, the evaporation region 0111 and the buffer region 0112 provided by an embodiment of the present disclosure, the opening region 0121 and the evaporation region 0111 each have a circular shape, the buffer region 0112 has an annular shape, a radius of an inner ring of the buffer region 0112 is equal to a radius of the evaporation region 0111, a radius of the opening region 0121 is larger than the radius of the inner ring of the buffer region 0112 and smaller than a radius of an outer ring of the buffer region 0112.

In some embodiments, the first mask may be an Open MASK, the second mask 011 may be a FMM, the first mask and the second mask 011 have a same shape and have sizes equal to each other. Exemplarily, the frame 013 may has a rectangular shape, the frame may be a metal frame, the first mask 012 and the second mask 011 each has a rectangular shape, and the first mask 012 and the second mask 011 are welded onto the frame 013 respectively, which will not particularly limited in embodiments of the present disclosure.

In the mask assembly 01 shown in FIG. 2B, the first mask may be deformed under a force when the second mask 011 is welded relative to the first mask 012, which may lead to a change in relative position between the opening region 0121 of the first mask and the frame 013; however, the evaporation region 0111 of the mask assembly 01 is defined by the second mask 011 and the second mask 011 further comprises the buffer region 0112, thus even if the relative position between the opening region 0121 of the first mask and the frame 013 is changed, the evaporation region of the mask assembly 01 will not be changed as long as the orthographic projection of the boundary of the opening region 0121 of the changed first mask is still located within the buffer region 0112. For example, the first mask 012 may be deformed under a force when the second mask 011 is welded relative to the first mask 012, which may lead to a change in relative position between the opening region 0121 of the first mask 012 and the frame 013, so that the opening region 0121 of the first mask 012 is changed from the position shown in FIG. 2B to the position shown in FIG. 2F.

Figure 2F:
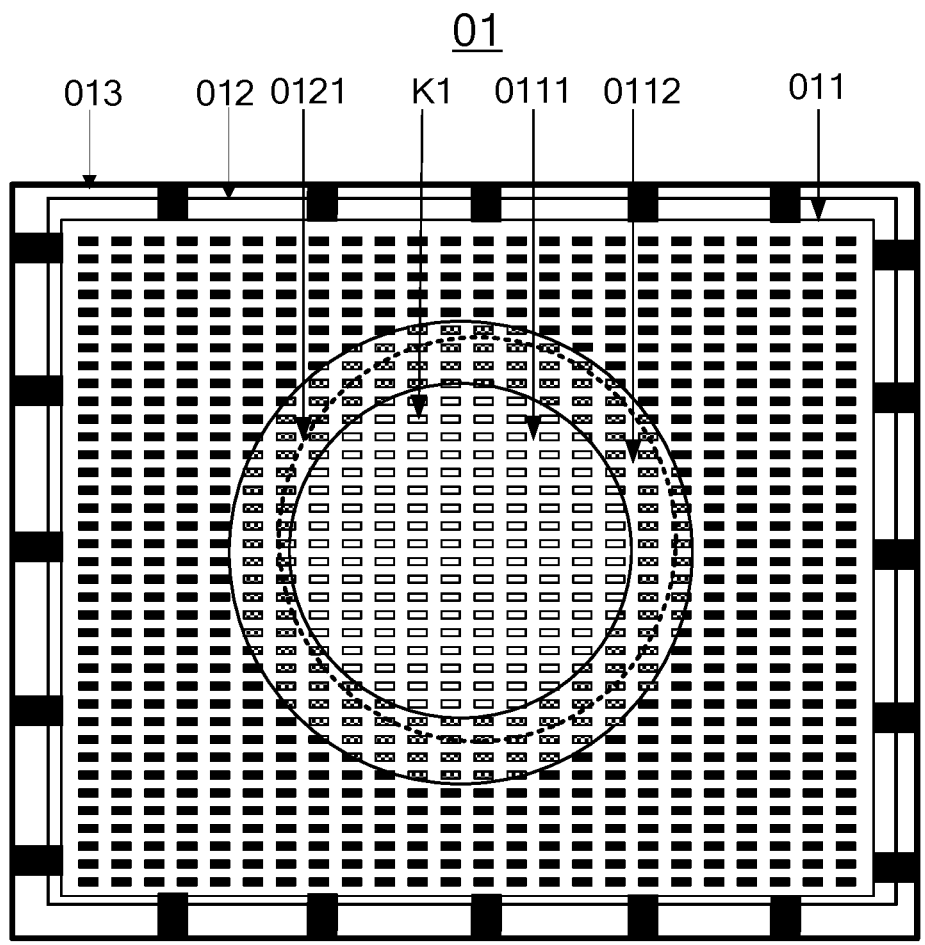
FIG. 2F is a plan schematic diagram showing a structure of a mask assembly according to another embodiment of the present disclosure.

Referring to FIG. 2F, it can be seen that the orthographic projection of the boundary of the opening region 0121 of the changed first mask 012 is still located within the buffer region 0112, thus the evaporation region 0111 of the mask assembly 01 is not changed, and the change in position of the opening region 0121 of the first mask will not adversely affect the position of the evaporation region 0111 of the mask assembly 01. Thus, the mask assembly 01 provided by embodiments of the present disclosure has a better alignment accuracy.

Figure 2G:
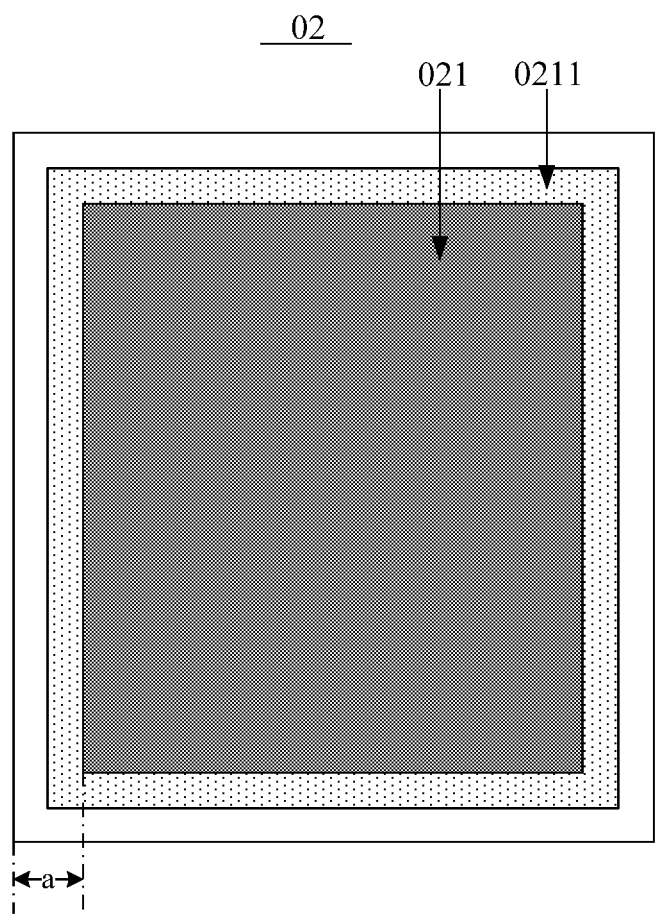
FIG. 2G is a structural schematic diagram of a substrate provided in related arts.

In related arts, the evaporation region of the mask assembly is defined by the opening region of the Open MASK, and the Open MASK has a lower accuracy than the FMM, so a formed pattern has a poorer quality; in view of this, when a pattern (for example, an organic electroluminescence pattern, an electrode pattern) is to be formed, in order to avoid failing of a pixel at the periphery of a display region of a substrate, a blank area is generally provided around the display region of the substrate, a buffer or dummy pixel is formed in the blank area to provide buffer protection to pixels in the display region, and the buffer pixel is not used for image display. Exemplarily, as shown in FIG. 2G, a blank area 0211 may be provided around a display region 021 of a substrate 02, and a buffer pixel is formed in the blank area 0211; as such, when the pixel of the substrate 02 fails, the pixel which firstly fails is the buffer pixel in the blank area 0211, thus the buffer pixel may protect the pixel in the display region 021 for displaying an image. However, after the blank area 0211 is provided, as shown in FIG. 2G, the width of the edge of the substrate is a, the substrate 02 has a wider edge, resulting in difficulty in achieving a narrow frame display.

Figure 2H:
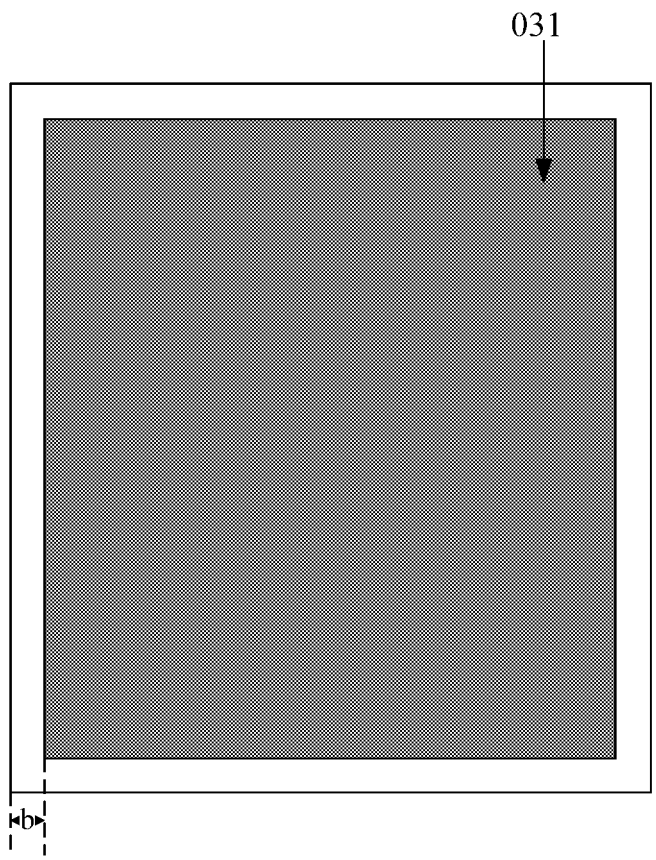
FIG. 2H is a structural schematic diagram of a substrate provided by an embodiment of the present disclosure.

The evaporation region of the mask assembly provided by embodiments of the present disclosure is defined by the FMM, while the FMM has a higher accuracy, forming a pattern with a better quality. As such, when a pattern is formed, it is not needed to form buffer pixels on the substrate, and thereby it is not needed to provide any blank area around the display region of the substrate. Exemplarily, as shown in FIG. 2H, no blank area is needed to be provided around the display region 031 of the substrate 03, and in this case, the edge of the substrate 03 has a width b and is narrower (b<a), and a narrow frame display may be achieved.

In related arts, in order to improve the alignment accuracy of the mask assembly, it is required to continuously improve the opening accuracy of the Open MASK, while the Open MASK is a mask having a lower accuracy, and process of improving the opening accuracy of the Open MASK is complex, resulting in higher difficulty in process of manufacturing the Open MASK. In embodiments of the present disclosure, the evaporation region of the mask assembly is defined by the FMM, thus the alignment accuracy of the mask assembly may be improved without requiring the Open MASK has a higher opening accuracy, thus requirements to the opening accuracy of the Open MASK may be reduced, and the difficulty in process of manufacturing the Open MASK is reduced.

A display generally includes a liquid crystal display (LCD for shot), an OLED display, a plasma display panel (PDP for short) display and an electric ink display, and the OLED display, due to its advantages such as thin and light, active luminescence, a fast response speed, a wide angle of view, rich colors, high brightness, a low power consumption, resistance to high and low temperature and the like, is deemed in the industry as the third generation display technique following the LCD display and may be widely applied in terminal products such as a smart mobile phone, a tablet computer, a TV set. With hot sale of the Apple watch recently, application of the OLED display in a watch quickly leads the trend, and the mask assembly provided by embodiments of the present disclosure may be used to manufacture a display of the watch and has broad application prospects and market demand.

In summary, in the mask assembly provided by the embodiments of the present disclosure, the evaporation region of the mask assembly is defined by the second mask, the orthographic projection of the boundary of the opening region of the first mask onto the second mask is located within the buffer region of the second mask surrounding the evaporation region, and the buffer region is used to block off the evaporation material. As such, due to presence of the buffer region, a change in position of the opening region when fixing the second mask will not adversely affect the evaporation region, thus the mask assembly has a higher alignment accuracy, solving the problem of the lower alignment accuracy of the mask assembly in related art, achieving effect of improving the alignment accuracy of the mask assembly.

Figure 3:
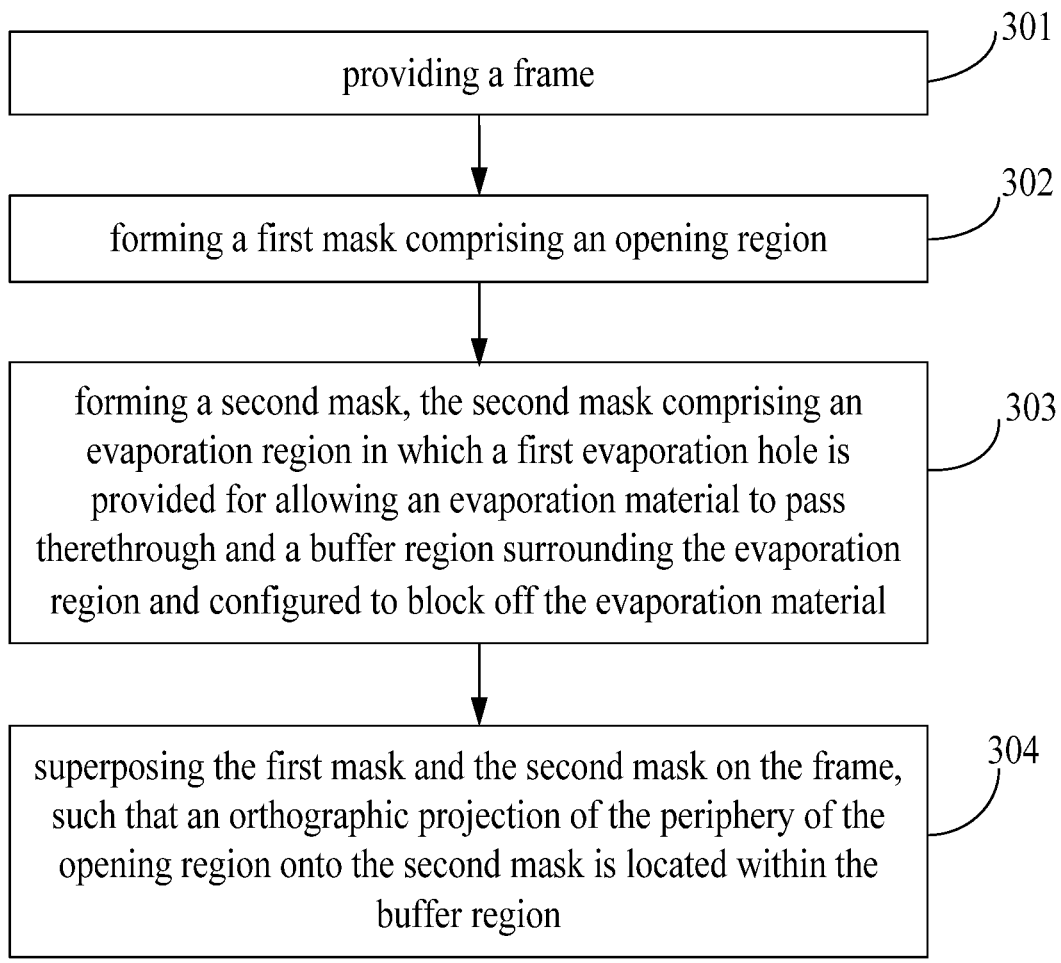
FIG. 3 is a flowchart of a method for manufacturing a mask assembly according to an embodiment of the present disclosure.

Please refer to FIG. 3, which shows a flowchart of a method for manufacturing a mask assembly according to an embodiment of the present disclosure, and the method may be used to manufacture the mask assembly 01 shown in FIG. 2B. Referring to FIG. 3, the method may comprise following steps:

step 301: providing a frame;

step 302: forming a first mask comprising an opening region;

step 303: forming a second mask, the second mask comprising an evaporation region in which a first evaporation hole is provided for allowing an evaporation material to pass therethrough and a buffer region surrounding the evaporation region and configured to block off the evaporation material; and step 304: superposing the first mask and the second mask on the frame, such that an orthographic projection of the boundary of the opening region onto the second mask is located within the buffer region.

In summary, with the method for manufacturing a mask assembly according to the embodiment of the present disclosure, the evaporation region of the mask assembly is defined by the second mask, the orthographic projection of the boundary of the opening region of the first mask onto the second mask is located within the buffer region of the second mask surrounding the evaporation region, and the buffer region is used to block off the evaporation material. As such, due to presence of the buffer region, a change in position of the opening region when fixing the second mask will not adversely affect the evaporation region, thus the mask assembly has a higher alignment accuracy, solving the problem of the lower alignment accuracy of the mask assembly in related art, achieving effect of improving the alignment accuracy of the mask assembly.

In an embodiment, a first recess is provided in the buffer region.

In an embodiment, an opening face of the first recess is located at a face of the second mask facing away from the first mask.

In an embodiment, the buffer region has an annular shape.

In some embodiments, the first mask further comprises a first peripheral region surrounding the opening region and configured to block off the evaporation material;

the second mask further comprises a second peripheral region surrounding the buffer region, and the step of superposing the first mask and the second mask on the frame may further comprise:

superposing the first mask and the second mask on the frame such that an orthographic projection of the second peripheral region onto the first mask is located within the first peripheral region In an embodiment, an evaporation hole is provided in the second peripheral region; or a second recess is provided in the second peripheral region.

In some embodiments, a first recess is provided in the buffer region, opening faces of all the evaporation holes have areas equal to each other, opening faces of all the recesses have areas equal to each other, an area of an opening face of each evaporation hole is equal to an area of an opening face of each recess, and/or a depth of each recess is larger than or equal to a half of a thickness of the second mask and smaller than the thickness of the second mask.

In some embodiments, the opening region and the evaporation region each have a circular shape, the buffer region has an annular shape, a radius of an inner ring of the buffer region is equal to a radius of the evaporation region, and/or a radius of the opening region is larger than the radius of the inner ring of the buffer region and smaller than a radius of an outer ring of the buffer region.

In an embodiment, the frame is a metal frame, the second mask is a fine metal mask, and the step 304 comprises:

welding the first mask and the second mask onto the frame respectively such that the first mask and the second mask are superposed on each other.

In summary, with the method for manufacturing a mask assembly according to the embodiment of the present disclosure, the evaporation region of the mask assembly is defined by the second mask, the orthographic projection of the boundary of the opening region of the first mask onto the second mask is located within the buffer region of the second mask surrounding the evaporation region, and the buffer region is used to block off the evaporation material. As such, due to presence of the buffer region, a change in position of the opening region when fixing the second mask will not adversely affect the evaporation region, thus the mask assembly has a higher alignment accuracy, solving the problem of the lower alignment accuracy of the mask assembly in related art, achieving effect of improving the alignment accuracy of the mask assembly.

Figure 4:
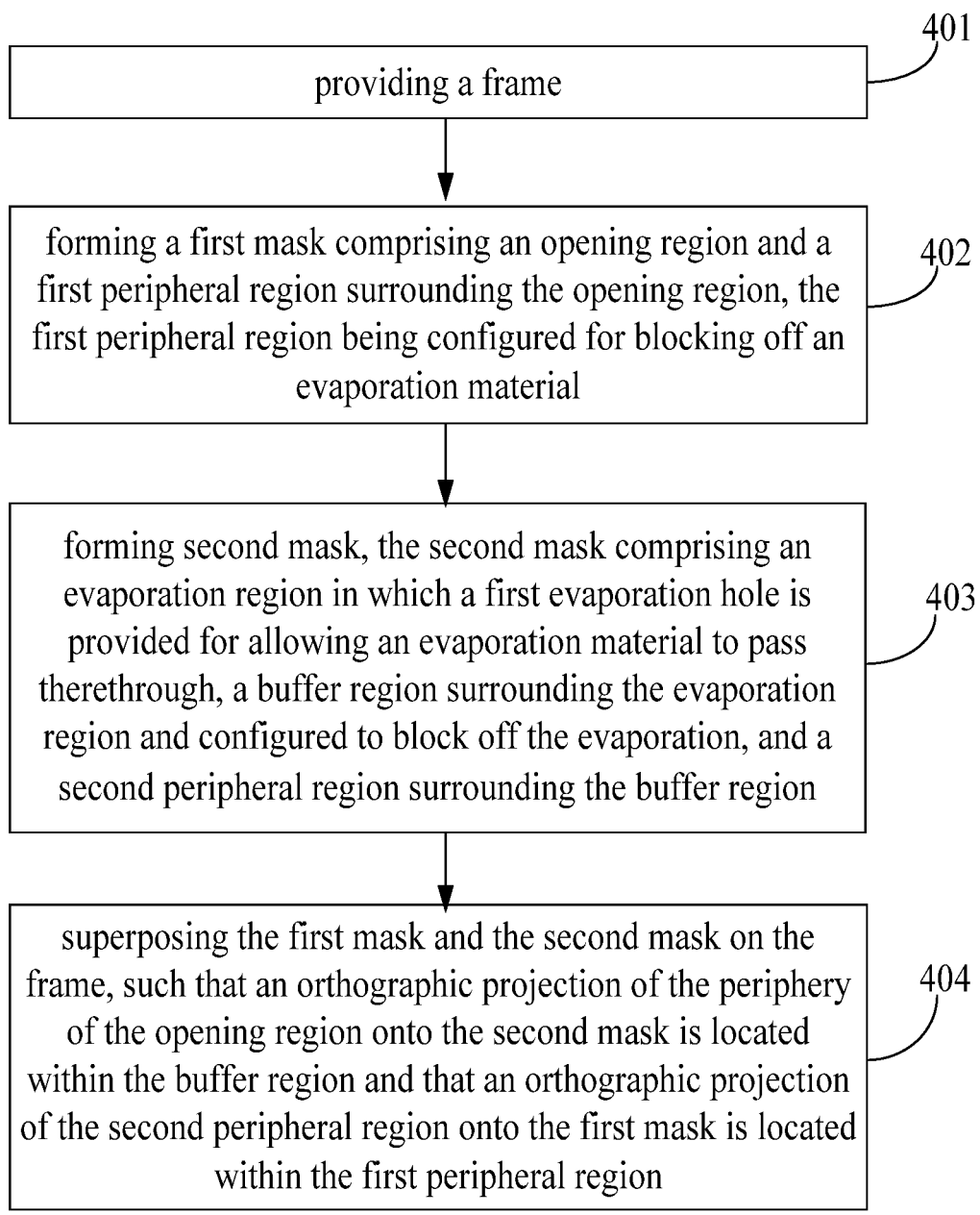
FIG. 4 is a flowchart of a method for manufacturing a mask assembly according to another embodiment of the present disclosure.

Please refer to FIG. 4, which shows a flowchart of a method for manufacturing a mask assembly according to another embodiment of the present disclosure, and the method may be used to manufacture the mask assembly 01 shown in FIG. 2B. Referring to FIG. 4, the method may comprise following steps:

step 401: providing a frame.

In embodiments of the present disclosure, specific structure of the frame and a method for manufacturing the same may refer to related techniques, and will not be repeatedly described in embodiments of the present disclosure.

Step 402: forming a first mask comprising an opening region and a first peripheral region surrounding the opening region, the first peripheral region being configured for blocking off an evaporation material.

In an example, the first mask 012 may be an Open MASK, as shown in FIG. 2C, and comprises an opening region 0121 and a first peripheral region 0122 surrounding the opening region 0121, and the first peripheral region 0122 is configured to block off an evaporation material. Exemplarily, the first mask 012 has a rectangular surface, the opening region

0121 may have a circular shape, and the first peripheral region 0122 is a region of the first mask 012 except the opening region 0121.

In an embodiment of the present disclosure, the first mask 012 may comprises a first mask body, which is a rectangular plate including no pattern and may be processed to form the first mask 012 through one patterning process. Exemplarily, the one patterning process may include coating photoresist, exposure, development, etching and peeling off photoresist, and thus the one patterning process through which the first mask body is processed to form the first mask 012 may comprise: coating a layer of photoresist of a thickness on the first mask body to form a photoresist layer, exposing the photoresist layer through a mask having a corresponding pattern such that the photoresist layer is formed with a full exposure region corresponding to an opening region of a first mask to be formed and a non-exposure region corresponding to a first peripheral region of the first mask to be formed, then processing the photoresist layer by using a development process such that photoresist in the full exposure region is fully removed and photoresist in the non-exposure region is completely remained, etching a region of the first mask body corresponding to the full exposure region by using an etching process so as to form an opening region 0121 of the first mask, and then peeling off the photoresist in the non-exposure region so as to form a first peripheral region 0122 of the first mask, thereby forming the first mask 012 after having formed the opening region 0121 and the first peripheral region 0122 of the first mask.

It is noted that embodiments of the present disclosure are described by taking positive photoresist to form the first mask 012 as an example, and in practice application, negative photoresist may be used to form the first mask 012, which will not particularly limited in the embodiments of the present disclosure.

It is also noted that, the mask having the corresponding pattern used when forming the first mask 012 in Step 402 is different from the first mask 012, and the mask having the corresponding pattern may be a mask comprising a light transmitting region and a light shielding region, which will not repeatedly described in embodiments of the present disclosure.

Step 403: forming a second mask, the second mask comprising an evaporation region in which a first evaporation hole is provided for allowing an evaporation material to pass therethrough, a buffer region surrounding the evaporation region and configured to block off the evaporation material, and a second peripheral region surrounding the buffer region.

In some example, the second mask 011 may be a FMM, as shown in FIG. 2D, and comprises an evaporation region 0111, a buffer region 0112 surrounding the evaporation region 0111 and a second peripheral region 0113 surrounding the buffer region 0112, the second mask 011 has a rectangular surface, the evaporation region 0111 may have a circular shape, the buffer region 0112 has an annular shape, and the second peripheral region 0113 is a region of the second mask 011 except the evaporation region 0111 and the buffer region 0112. In some embodiments of the present disclosure, an evaporation hole K1 is provided in the evaporation region 0111 for allowing an evaporation material to pass therethrough, a first recess C is provided in the buffer region 0112, and an evaporation hole K2 is provided in the second peripheral region 0113. Exemplarily, the evaporation hole may be a circular hole, a rectangular hole, a square hole or other shaped-hole, opening faces of all the evaporation holes have same shapes and have areas equal to each other, opening faces of all the recesses have same shapes and have areas equal to each other, an area of an opening face of each of the evaporation holes is equal to an area of an opening face of each of the recesses, and/or a depth of each of the recesses is larger than or equal to a half of a thickness of the second mask 011 and smaller than the thickness of the second mask.

In an embodiment of the present disclosure, the second mask 011 may comprises a second mask body, which is a rectangular plate including no pattern and may be processed through one patterning process to form the second mask 011. In an example, the one patterning process may include coating photoresist, exposure, development, etching and peeling off photoresist, and thus the one patterning process through which the second mask body is processed to form the second mask 011 may comprise: coating a layer of photoresist with a certain thickness on the second mask body to form a photoresist layer, exposing the photoresist layer through a gray mask or a halftone mask with corresponding pattern such that the photoresist layer is formed with a full exposure region corresponding to an evaporation hole of a second mask to be formed, a partial exposure region corresponding to a recess of the second mask to be formed and a non-exposure region corresponding to other regions of the second mask, then processing the photoresist layer by using a development process such that photoresist in the full exposure region is fully removed, photoresist in the partial exposure region is partially removed and photoresist in the non-exposure region is completely remained, etching a region of the second mask body corresponding to the full exposure region by using an etching process so as to form the evaporation hole of the second mask, then removing the photoresist in the partial exposure region by using a process such as development, ashing or peeling, and etching a region of the second mask body corresponding to the partial exposure region by using an etching process so as to form the recess of the second mask, and peeling off the photoresist in the non-exposure region, thereby obtaining the second mask 011.

It is noted that embodiments of the present disclosure are described by taking positive photoresist for forming the second mask 011 as an example, and in practice application, negative photoresist may be used for forming the second mask 011, which will not particularly limited in the embodiments of the present disclosure.

It is also noted that the step 403 is described by taking one patterning process, in which a gray mask or a halftone mask is used to form the second mask 011 as an example, and in practice application, the second mask 011 may be formed through two patterning processes, which will not be repeatedly described in embodiments of the present disclosure.

Step 404: superposing the first mask and the second mask on the frame, such that an orthographic projection of the boundary of the opening region onto the second mask is located within the buffer region, and an orthographic projection of the second peripheral region onto the first mask is located within the first peripheral region.

In an example, after the first mask 012 and the second mask 011 are supposed on the frame, the mask assembly 01 is formed, and its specific structure may refer to FIG. 2B and will not be repeatedly described in embodiments of the present disclosure.

In some embodiments of the present disclosure, the frame may have a rectangular shape, the first mask 012 and the second mask 011 may each have a rectangular shape, the frame may be a metal frame, and the material of each of the first mask 012 and the second mask 011 may be metal. Thus, the first mask 012 and the second mask 011 may be welded onto the frame respectively such that the first mask 012 and the second mask 011 are superposed on each other. Specifically, the first mask 012 may be firstly welded onto the frame, and then the second mask 011 is welded onto the frame, such that the opening face of the first recess C in the buffer region of the second mask 011 is located at a surface of the second mask 011 facing away from the first mask 012, and that an orthographic projection of the second peripheral region 0113 of the second mask 011 onto the first mask 012 is located within the first peripheral region 0122 of the first mask 012.

In some embodiments of the present disclosure, the opening region 0121 of the first mask 012 has a circular shape, the evaporation region 0111 of the second mask 011 has a circular shape, the buffer region 0112 has an annular shape, a radius of an inner ring of the buffer region 0112 is equal to a radius of the evaporation region 0111, and/or a radius of the opening region 0121 is larger than the radius of the inner ring of the buffer region 0112 and smaller than a radius of an outer ring of the buffer region 0112, which will not be repeatedly described in embodiments of the present disclosure.

In summary, with the method for manufacturing a mask assembly according to embodiments of the present disclosure, the evaporation region of the mask assembly is defined by the second mask, the orthographic projection of the boundary of the opening region of the first mask onto the second mask is located within the buffer region of the second mask surrounding the evaporation region, and the buffer region is used to block off the evaporation material. As such, due to presence of the buffer region, a change in position of the opening region when fixing the second mask will not adversely affect the evaporation region, thus the mask assembly has a higher alignment accuracy, solving the problem of the lower alignment accuracy of the mask assembly in related art, achieving effect of improving the alignment accuracy of the mask assembly.

An embodiment of the present disclosure further provides a display device, comprising a pattern formed by using the mask assembly shown in FIG. 2B. The display device may be any products or components having a display function, such as a watch, an electronic paper, a cell phone, a tablet computer, a television, a display, a notebook computer, a digital photo frame, a navigator, or the like.

In summary, the display device provided by the embodiment of the present disclosure comprises a pattern formed by using the mask assembly, the evaporation region of the mask assembly is defined by the second mask, the orthographic projection of the boundary of the opening region of the first mask onto the second mask is located within the buffer region of the second mask surrounding the evaporation region, and the buffer region is used to block off the evaporation material. As such, due to presence of the buffer region, a change in position of the opening region when fixing the second mask will not adversely affect the evaporation region, thus the mask assembly has a higher alignment accuracy, the formed pattern has a better quality, and the display device has a better display effect.

It will be appreciated by those skilled in the art that all or a part of steps in the above embodiments may be implemented by hardware, or may be implemented by instructing relevant hardware by programs, which may be stored in a computer readable storage medium, and the storage medium may be a ROM, a magnetic disk, a CD or the like.

The above described contents are merely exemplary embodiments of the disclosure, and the scope of the present disclosure is not limited thereto. Changes, alternations or modification made within spirit and principle of the present disclosure shall fall within the scope of the present disclosure.

What is claimed is:

1. A mask assembly, comprising a frame, a first mask and a second mask, the first mask and the second mask being superposed on the frame;
   wherein the first mask comprises an opening region, the second mask comprises an evaporation region in which a first evaporation hole is provided for allowing an evaporation material to pass therethrough and a buffer region surrounding the evaporation region and configured to block off the evaporation material, and an orthographic projection of a boundary of the opening region onto the second mask is located within the buffer region,
   wherein a plurality of first recesses are provided in the buffer region and spaced from each other, and
   wherein an area of an opening face of the first evaporation hole is equal to an area of an opening face of each of the first recesses.

2. The mask assembly according to claim 1, wherein, the plurality of first recesses function as a first buffer structure and are configured to reduce a stress difference between the buffer region and the evaporation region.

3. The mask assembly according to claim 1, wherein, opening faces of the first recesses are located at a face of the second mask facing away from the first mask.

4. The mask assembly according to claim 1, wherein the buffer region has an annular shape.

5. The mask assembly according to claim 1, wherein, the first mask further comprises a first peripheral region surrounding the opening region and configured to block off the evaporation material; and
   the second mask further comprises a second peripheral region surrounding the buffer region, and an orthographic projection of the second peripheral region onto the first mask is located within the first peripheral region.

6. The mask assembly according to claim 5, wherein, a second buffer structure is provided in the second peripheral region and configured to reduce a stress difference between the second peripheral region and the evaporation region, and the second buffer structure comprises a second evaporation hole and/or a second recess formed in the second peripheral region.

7. The mask assembly according to claim 1, wherein, the mask assembly comprises at least one of following items (1) to (9):
   (1) a plurality of evaporation holes are provided in the evaporation region, and opening faces of all the evaporation holes have areas equal to each other;
   (2) opening faces of all the first recesses have areas equal to each other;
   (3) a plurality of evaporation holes are provided in the evaporation region, and an area of an opening face of each of the evaporation holes is equal to an area of an opening face of each of the first recesses;
   (4) a depth of each of the first recesses is larger than or equal to a half of a thickness of the second mask and smaller than the thickness of the second mask;
   (5) the opening region has a circular shape;
   (6) the evaporation region has a circular shape;
   (7) the buffer region has an annular shape;

(8) a radius of an inner ring of the buffer region is equal to a radius of the evaporation region; and
(9) a radius of the opening region is larger than the radius of the inner ring of the buffer region and smaller than a radius of an outer ring of the buffer region.

8. The mask assembly according to claim 1, wherein, the frame is a metal frame, the second mask is a fine metal mask, and the first mask and the second mask are welded onto the frame respectively.

9. A method for manufacturing a mask assembly, comprising steps of:
providing a frame;
forming a first mask comprising an opening region;
forming a second mask, the second mask comprising an evaporation region in which a first evaporation hole is provided for allowing an evaporation material to pass therethrough and a buffer region surrounding the evaporation region and configured to block off the evaporation material; and
superposing the first mask and the second mask on the frame, such that an orthographic projection of a boundary of the opening region onto the second mask is located within the buffer region,
wherein a plurality of first recesses are provided in the buffer region and spaced from each other, and
wherein an area of an opening face of the first evaporation hole is equal to an area of an opening face of each of the first recesses.

10. The method according to claim 9, wherein the step of forming a second mask comprises forming, in the buffer region, the plurality of first recesses as a first buffer structure, the plurality of first recesses being configured to reduce a stress difference between the buffer region and the evaporation region.

11. The method according to claim 9, wherein, opening faces of the first recesses are located at a face of the second mask facing away from the first mask.

12. The method according to claim 9, wherein the buffer region has an annular shape.

13. The method according to claim 9, wherein, the first mask further comprises a first peripheral region surrounding the opening region and configured to block off the evaporation material;
the second mask further comprises a second peripheral region surrounding the buffer region, and
the step of superposing the first mask and the second mask on the frame further comprises:
superposing the first mask and the second mask on the frame such that an orthographic projection of the second peripheral region onto the first mask is located within the first peripheral region.

14. The method according to claim 13, wherein, a second buffer structure is provided in the second peripheral region and configured to reduce a stress difference between the second peripheral region and the evaporation region, and the second buffer structure comprises a second evaporation hole and/or a second recess formed in the second peripheral region.

15. The method according to claim 13, wherein, the mask assembly is manufactured such that it comprises at least one of following items (1) to (9):
(1) a plurality of evaporation holes are provided in the evaporation region, and opening faces of all the evaporation holes have areas equal to each other;
(2) opening faces of all the first recesses have areas equal to each other;
(3) a plurality of evaporation holes are provided in the evaporation region, and an area of an opening face of each of the evaporation holes is equal to an area of an opening face of each of the first recesses;
(4) a depth of each of the first recesses is larger than or equal to a half of a thickness of the second mask and smaller than the thickness of the second mask;
(5) the opening region has a circular shape;
(6) the evaporation region has a circular shape;
(7) the buffer region has an annular shape;
(8) a radius of an inner ring of the buffer region is equal to a radius of the evaporation region; and
(9) a radius of the opening region is larger than the radius of the inner ring of the buffer region and smaller than a radius of an outer ring of the buffer region.

16. The method according to claim 9, wherein, the frame is a metal frame, and the second mask is a fine metal mask, and
the step of superposing the first mask and the second mask on the frame comprises:
welding the first mask and the second mask onto the frame respectively such that the first mask and the second mask are superposed on each other.

17. A display device, comprising a pattern formed by using the mask assembly of claim 1.

18. The mask assembly according to claim 6, wherein, the mask assembly comprises at least one of following items (1) to (9):
(1) a plurality of evaporation holes are provided in the evaporation region, and opening faces of all the evaporation holes have areas equal to each other;
(2) opening faces of all the first recesses have areas equal to each other;
(3) a plurality of evaporation holes are provided in the evaporation region, and an area of an opening face of each of the evaporation holes is equal to an area of an opening face of each of the first recesses;
(4) a depth of each of the first recesses is larger than or equal to a half of a thickness of the second mask and smaller than the thickness of the second mask;
(5) the opening region has a circular shape;
(6) the evaporation region has a circular shape;
(7) the buffer region has an annular shape;
(8) a radius of an inner ring of the buffer region is equal to a radius of the evaporation region; and
(9) a radius of the opening region is larger than the radius of the inner ring of the buffer region and smaller than a radius of an outer ring of the buffer region.

* * * * *